United States Patent
Karabatsos

(10) Patent No.: US 8,134,412 B2
(45) Date of Patent: Mar. 13, 2012

(54) SYNCHRONIZATION OF A DATA OUTPUT SIGNAL TO AN INPUT CLOCK

(75) Inventor: Chris Karabatsos, Kingston, NY (US)

(73) Assignee: Urenschi Assets Limited Liability Company, Dover, DE (US)

( * ) Notice: Subject to any disclaimer, the term of this patent is extended or adjusted under 35 U.S.C. 154(b) by 36 days.

(21) Appl. No.: 12/555,139

(22) Filed: Sep. 8, 2009

(65) Prior Publication Data

US 2011/0181365 A1    Jul. 28, 2011

Related U.S. Application Data

(63) Continuation-in-part of application No. 12/356,130, filed on Jan. 20, 2009, now Pat. No. 7,605,666, which is a continuation-in-part of application No. 11/843,267, filed on Aug. 22, 2007, now Pat. No. 7,498,887, which is a continuation of application No. 11/308,518, filed on Mar. 31, 2006, now Pat. No. 7,276,982.

(60) Provisional application No. 60/670,618, filed on Apr. 13, 2005, provisional application No. 60/666,603, filed on Mar. 31, 2005.

(51) Int. Cl.
 *H03L 7/00* (2006.01)
(52) U.S. Cl. ............... 331/16; 331/25; 331/57; 327/141
(58) Field of Classification Search .................. 331/16, 331/25, 57; 327/103–107, 141–163
See application file for complete search history.

(56) References Cited

U.S. PATENT DOCUMENTS

| | | | |
|---|---|---|---|
| 5,796,673 A | 8/1998 | Foss et al. | |
| 6,075,415 A * | 6/2000 | Milton et al. | ............... 331/25 |
| 6,396,312 B1 | 5/2002 | Shepston et al. | |
| 6,608,530 B1 | 8/2003 | Green et al. | |
| 6,917,660 B2 | 7/2005 | Song | |
| 7,206,370 B2 | 4/2007 | Nakao | |
| 7,605,666 B2 * | 10/2009 | Karabatsos | ............... 331/16 |
| 2002/0105389 A1 * | 8/2002 | Nishimura et al. | ........... 331/100 |
| 2004/0095861 A1 * | 5/2004 | Hsu et al. | ................... 369/47.28 |

OTHER PUBLICATIONS

Non-final Office Action issued in U.S. Appl. No. 11/308,518 and mailed on Apr. 27, 2007.
Non-final Office Action issued in U.S. Appl. No. 11/843,267 and mailed on Sep. 15, 2008.
Notice of Allowance issued in U.S. Appl. No. 11/308,518 and mailed on May 29, 2007.
Notice of Allowance issued in U.S. Appl. No. 11/733,254 and mailed Jun. 4, 2009.
Notice of Allowance issued in U.S. Appl. No. 11/843,267 and mailed Oct. 17, 2008.
Notice of Allowance issued in U.S. Appl. No. 12/356,130 and mailed on Jun. 5, 2009.

\* cited by examiner

*Primary Examiner* — Joseph Chang
*Assistant Examiner* — Jeffrey Shin

(57) ABSTRACT

A digital apparatus for phase aligning output signals of a silicon device to an applied input clock signal in same device allows synchronization of data transfers between the device and another device such as a controller. It includes a digital or analog oscillator of higher frequencies than the applied clock and in multiples of powers $2^n$ where n=1, 2, 4, etc., with provisions for synchronization and control by the applied input clock. The main oscillator frequency is subdivided to lower frequencies. An internally derived duplicate frequency clock is phase shifted by either 45 or 22.5 degrees. The system measure both a desired coarse delay, and a fine delay to be applied to the path to phase align the output signal to the phase of the applied input clock.

16 Claims, 13 Drawing Sheets

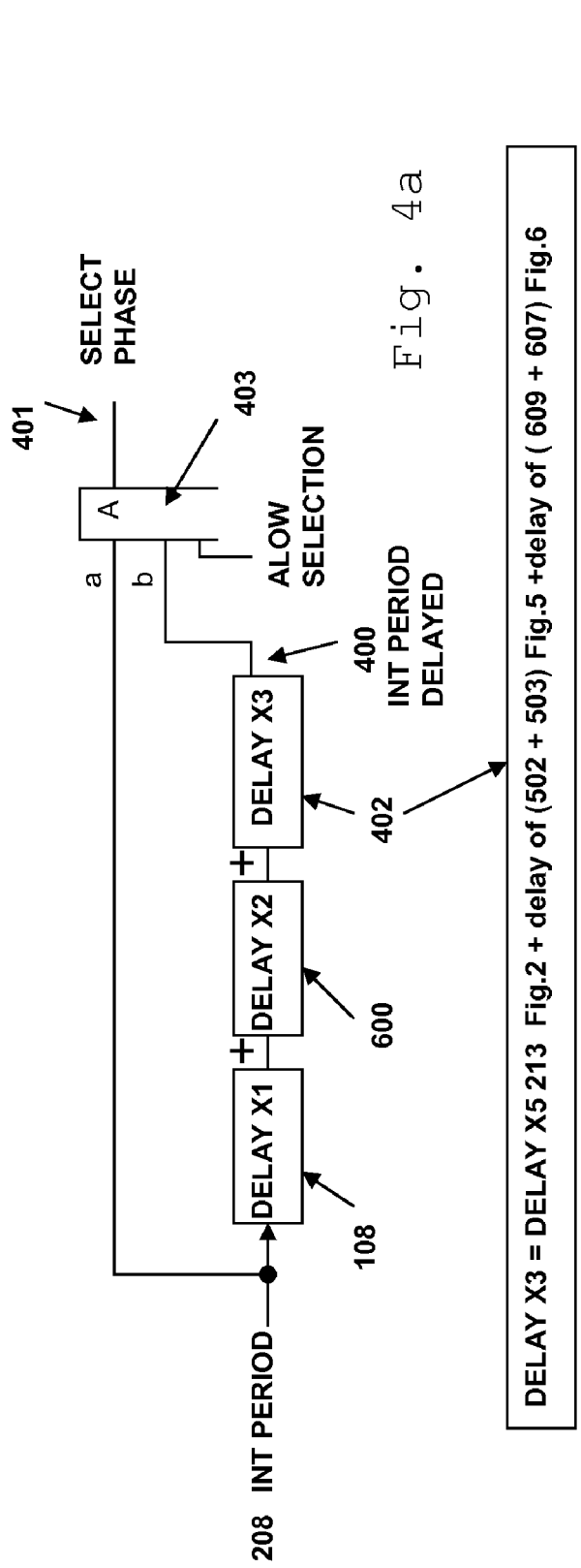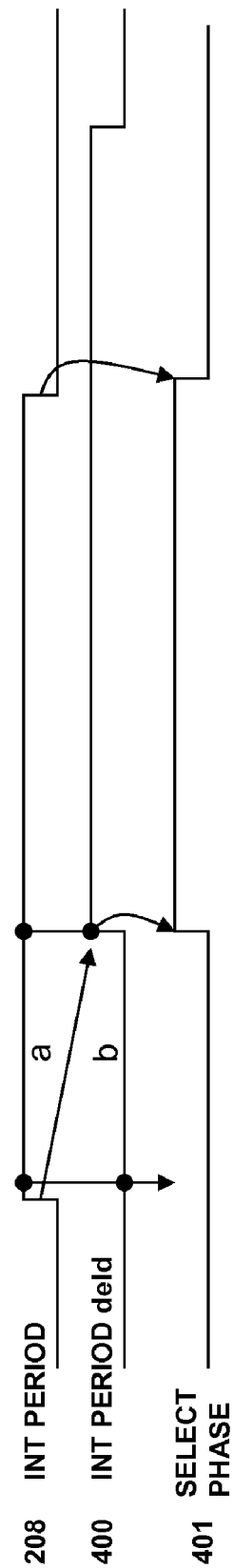

SYNCHRONIZATION OF A DATA OUTPUT SIGNAL TO AN INPUT CLOCK

REFERENCE TO RELATED APPLICATIONS

This application is a continuation-in-part of U.S. patent application Ser. No. 12/356,130, filed on Jan. 20, 2009, for a "High Frequency Digital Oscillator on Demand with Synchronization," which is a continuation-in-part of U.S. patent application Ser. No. 11/843,267, filed on Aug. 22, 2007, for a "High Frequency Digital Oscillator on Demand with Synchronization," which is a continuation of U.S. patent application Ser. No. 11/308,518, filed on Mar. 31, 2006, for a "High Speed Digital Oscillator-on-Demand with Synchronization," which claims priority from U.S. Provisional Patent Application No. 60/666,603, filed on Mar. 31, 2005, for a "High Speed Digital Oscillator-on Demand with Synchronization," and also from U.S. Provisional Patent Application No. 60/670,618, filed on Apr. 13, 2005, for "I/O Output to Clock Edge Synchronization."

FIELD OF THE INVENTION

This invention relates to the field of semiconductor memories or other devices that have a need to synchronize and phase align data and other output signals to the phase of an applied input clock for purposes of delivering said signals to another device, such as a controller, in a reliable and predictable manner. Said invention also applies to other semiconductor devices such as CPU's and Controllers that have a need to exchange data and other signals between them and other devices in synchronized manner to an applied clock input.

This invention also applies to delivering to distant devices clock signals equal in frequency to the applied input clock and phase aligned to same. Such clock signals are known as zero delay clock signals.

DESCRIPTION RELATIVE TO THE PRIOR ART

In many applications where an output signal from a silicon chip has to maintain a certain relation to the phase of an applied clock, a synchronization mechanism is required. In prior art, such as SDRAM devises, a data bit output named DQ has to be valid within a range of time before and or after the rising edge of the applied clock to the SDRAM device. Such time is defined in the specification time tables of the device as tAC (tACCESS) time from clock. The tAC time is defined to be a quantity of time before or after the rising edge of the clock. Many designs have been implemented in today's SDRAM, SRAM and GSDRAM devices to accomplish the tAC timings. One such device is known as Delay Locked Loop (DLL). U.S. Pat. No. 5,796,673 by Richard C. Foss et al. describes such DLL method. In all of the designs known, a clock is applied to the device and delay means, such as Delay Locked Loop, are used to phase shift its rising edge, use comparator circuits to align the phases of both signals, clock input and delayed clock, so that the output of the data bit signal will be available at the output pin at a predefined time when clocked by this delayed clock signal. Other synchronization method used, besides DLL, is the Phase Locked Loop (PLL) method. Such methods use some form of analogue circuitry for comparison of phases and resolution of the delay to be adjusted and applied to the clock path and as such take a lot of cycles to synchronize. The delayed synchronization makes such methods undesirable where stopping/starting the operation of such circuitry to conserve power without loss of time for synchronization is required.

Existing analogue type synchronizations use an undesirable amount of power, and require many cycles to re-synchronize to the applied clock. In some cases it is not desirable to mix digital with analog circuits in the same manufacturing process.

The PLL technique is mainly used to duplicate an applied input clock and distribute single or multiple output copies to distant devices or to internal circuits of the same device with phase synchronization at the receiving device. Such devices are known as zero clock buffer devices. One such requirement is employed in memory module apparatus where multiple SDRAM devices are attached on a printed circuit board and they all require to have input clock signals phase synchronized and aligned to a system clock. To accomplish this, a separate silicon device is designed to accept an input clock and to generate multiple output copies to be distributed to the SDRAM devices. The generation of said signals and the propagation to the distant devices produces a considerable phase shift. To eliminate this phase shift within practical and acceptable measures, the PLL accomplishes that by utilizing a feedback loop that is adjusted to duplicate the delay path and loads from the output of the PLL driver to the SDRAM devices and to compare the phase of this feedback loop to the clock applied to the PLL device. The phases of the applied clock and of the feedback clock are compared and converted to voltage. The result of the comparator controls a Voltage Controlled Oscillator (VCO) that has the ability to advance or retard the output clocks so that the clocks at the SDRAM devices are in phase with the said applied clock to the PLL input within acceptable measures.

It is the object to describe methods and apparatus' to accomplish similar results as prior art by use of digital methods and circuits with the added benefits of low power and stop/start feature without loss of time and synchronization and without mixing analog and digital design in the manufacturing processes.

BRIEF DESCRIPTION OF THE DRAWINGS

Better understanding of the invention will be obtained by reference to the drawings attached and which are described as follows.

FIG. 4a depicts the period signal applied to a basic delay circuit and to an AND circuit, thereby producing a timing signal for phase selection.

FIG. 4b is a timing diagram of signals appearing in FIG. 4a.

FIG. 8a depicts a collection of Set/Rest latches to measure duration of the incremental delay pulse.

FIG. 8b depicts a timing diagram of the circuit of FIG. 8a.

DETAILED DESCRIPTION OF THE INVENTION

The specification of U.S. patent application Ser. No. 12/356,130 filed on Jan. 20, 2009 for a "High Frequency Digital Oscillator on Demand with Synchronization" is incorporated herein by reference for the purpose of assisting in the understanding of the operation of the current device.

In the following description, the electronic elements are identified as follows:
CK=Latch
D=Driver
O=OR gate
R=receiver Referring now to FIG. 1, it should first be noted that the oscillator 100 shown has been described in the parent application referenced above. This oscillator will have a maximum frequency four times or eight times higher than CLK IN 112. For this embodiment the frequency will be considered to be four times higher than the frequency CLK IN 112 and is designated as 4×CLK 101.

The Oscillator will be synchronized to the CLK IN rising edge and will have the ability to STOP/START without requiring many cycles to resynchronize. The relationship of the CLK IN frequency and the oscillator 4×CLK frequency is shown in FIG. 3a. The difference in phase of the 4×CLK 101 and the CLK IN 112 is shown graphically as yz in the diagram of FIG. 3a. The phase difference between the CLK IN 112 and the equivalent internal clock CLK 00 200 in FIG. 3a is described in the block entitled DELAYX1 108 in FIG. 1. It is equal to the delays caused by modules 103, 104, 105, 106, and 107. In practice, other, miscellaneous delays caused by parasitics, etc, will also be added to these totals in calculated the actual delay between the input of adder 106 and the output of inverter 105. The delay DELAYX1 108 will vary from one oscillator to another, due to normal variations in the manufacturing process and further due to voltage and temperature variations during operation.

Figure 2:
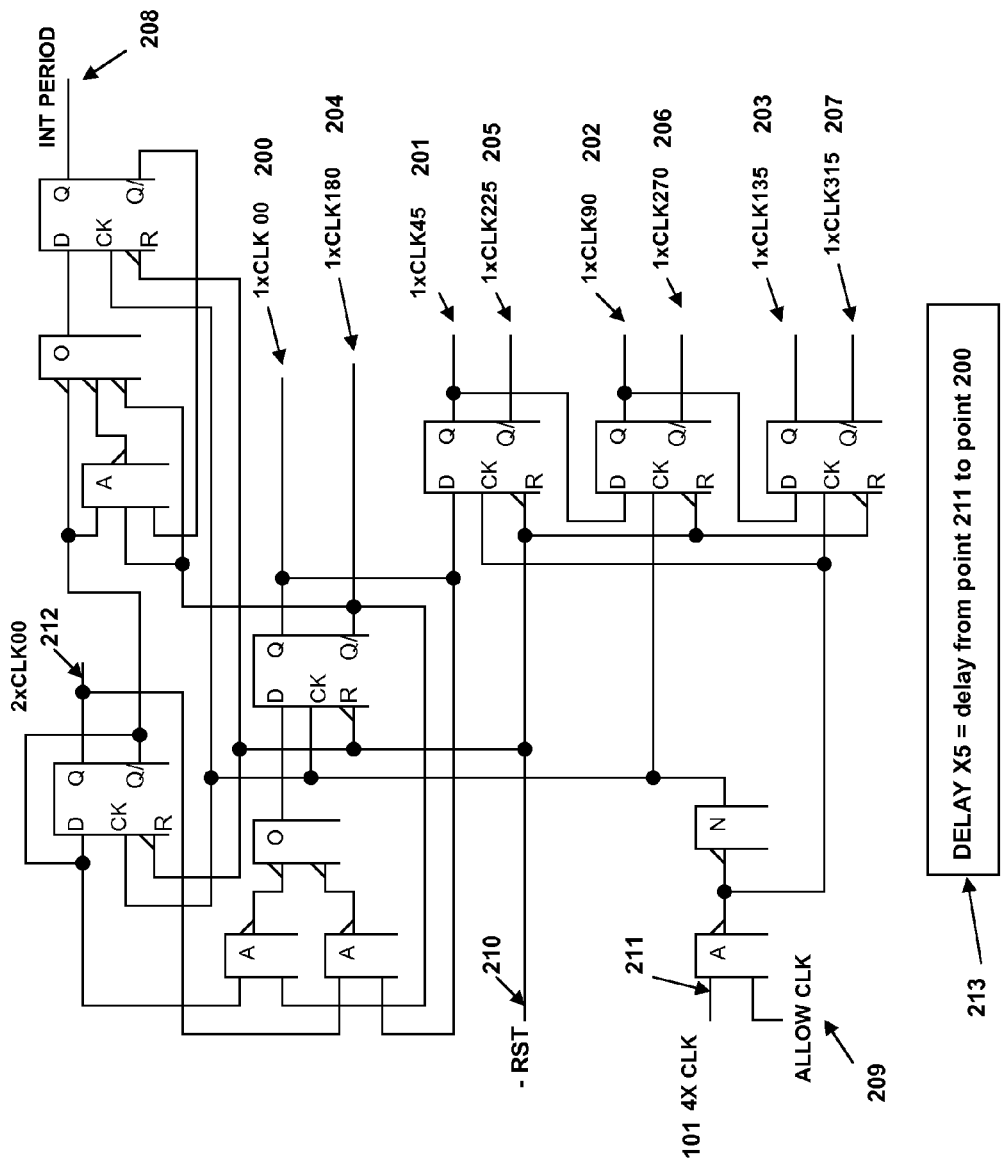
FIG. 2 depicts base ring oscillator frequency divider and phase shifter logic which produce phase shifted clocks every 45 degrees.

Referring now to FIG. 2. The 4× oscillator frequency signal is digitally divided by 2 to generate the signal 2×CLK00 212 and divided by 4 to generate the signal 1×CLK00 200 and its signal INT PERIOD 208. In continuation, the phase shifted clocks 1×CLK45 201, 1×CLK90 202, 1×CLK135 203, 1×CLK180 204, 1×CLK225 205, 1×CLK270 206, 1×CLK315 207 are also generated every 45 degrees or ⅛ cycle of the 1×CLK00 200 period. The 45 degree time from phase to phase will be different for each CLK IN frequency. One of the 1×CLK00 200 phase shifted clocks, applied through delay adjustments, will be used to clock the output drivers for DQ OUT 301 synchronization, as shown in FIG. 3b, or to produce multiple copies of the CLK IN signal 112 to drive other distant devices and maintain phase synchronization with the CLK IN signal.

Referring now to FIG. 3a. The timing diagrams of the signals produced and shown in FIG. 2 are shown herein for better understanding of the system operation. The portions of the waveforms identified by small alpha characters also appear in FIG.

In the first embodiment of the invention, the objective is to clock data drivers of a silicon device with a delayed phase of an applied input clock so that the data at the output pin of the device is in some specified phase relationship to the incoming clock phase. Small variations in these phase differences will be unavoidable due to manufacturing tolerances, and the effects of power supply and temperature variations.

Referring next to FIG. 3b, device 300 is shown in a simplified block diagram form. A CLK IN 112 is the base signal to which the output signals are synchronized. The signal flows from CLK IN 122 through path 303, and into the OR gate which is the left-most element of the DRV 304 circuit. A delayed version of said signal is also input to the OR gate, via DELAYED CLK EN2. The output of the OR gate is input to the DRIVER, which also receives a signal input DQ 1N 305 signal.

Referring now to FIG. 3c, an exemplary timing diagram of signals appearing in FIG. 3b is shown. The output of the driver DQ OUT 301 must be in phase with the CLK IN 112 within acceptable tolerance. The propagation of the CLK IN 112 within a normal internal path 303 circuits will clock the driver and produce the DQ OUT 301 after delay DL3. The output will be out of phase with the incoming clock as shown in the timing diagram. When the DELAYED CLK SIG 302 is applied to the driver 304 after delay DL1, the DQ OUT 301 will be in phase with CLK IN 112. The description of this operation may be better understood by referring next to FIGS. 4a and 4b.

The signal INT PERIOD 208 feeds two paths. One path is connected to one input of AND gate 403 and the other to a series of delay elements labeled DELAY X1 108, DELAY X2 600 and DELAY X3 402. DELAY X1 108 and DELAY X3 402 account for the total propagation delay from the CLK IN 112 pin to the input of the driver gate 611 (FIG. 6) at point 602 after the INCREMENTAL DELAY 607 has been selected. Initially, the INCREMENTAL DELAY 607 is assumed to be zero in order to select the proper phase clock. The produced output signal SELECT PHASE 401 of gate 403 is used to clock and latch the selected phase clock of FIG. 5. The selected phase clock must appear at the input of gate 611 at point 602 earlier than the expected DQ OUT 604 by an amount of time equal to the delay of the driver DELAY X2 600. The selection of incremental delay will fine adjust the phase clock to appear at the proper time at point 602.

Figure 5:
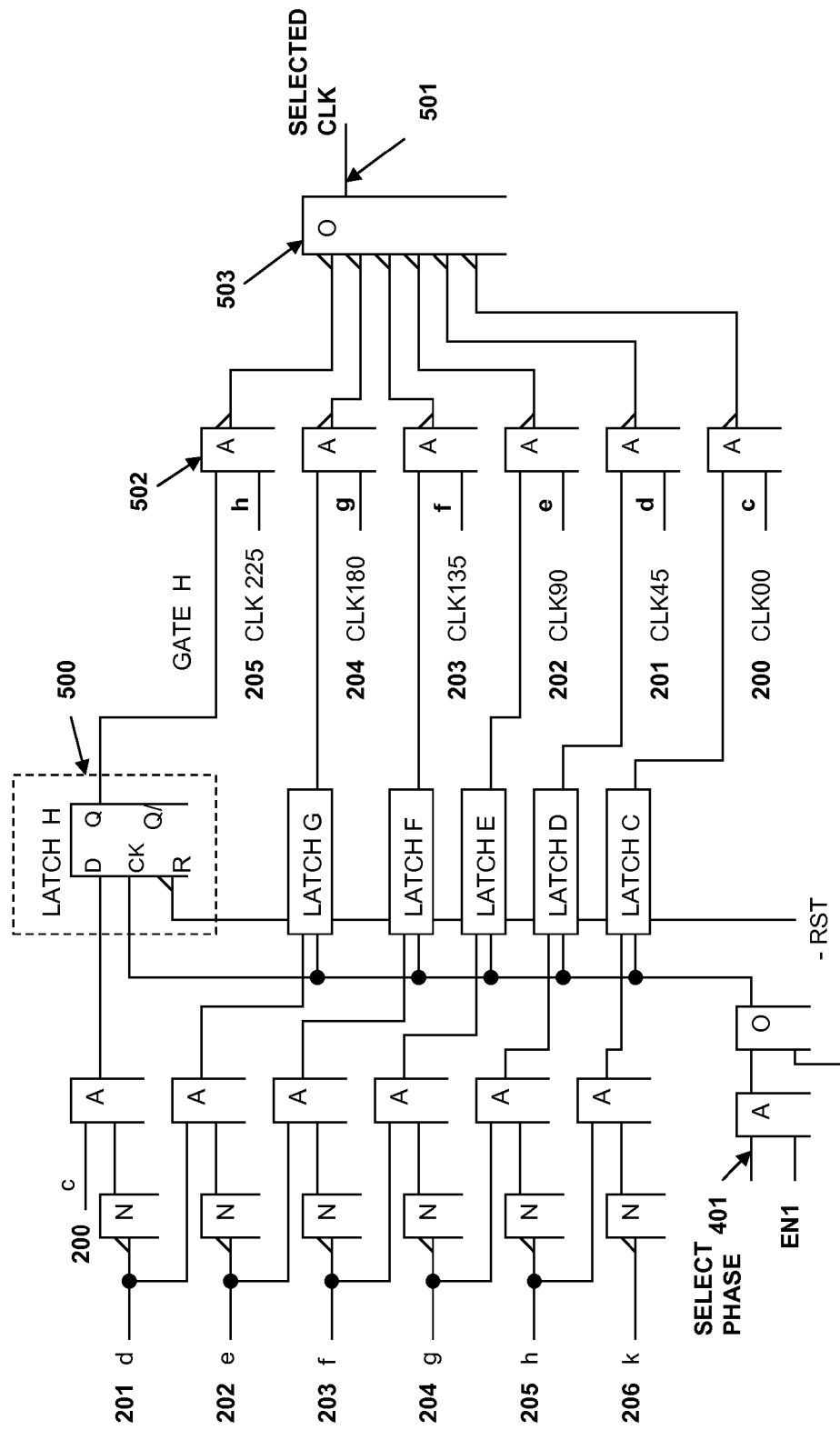
FIG. 5 depicts a digital logic implementation for phase clock selection.

The rising edge of the SELECT PHASE 401 is used to clock the appropriate latch 500 of FIG. 5. The latch will be set if the data input to the latch is Hi level at the time the rising edge occurs. The data input to each latch is depended on the Boolean expression implemented in gates as shown. One such Boolean expression could be (c) (d/) shown for LATCH H 500 as it appears in FIG. 5.

Various algorithms are available for selecting a particular phase delay. For example using devices of the zero delay buffer type, an earlier phase may be compared to that of the synchronized data output. The selected clock phase must be such so that its propagation through the selection gates 502 and 503 of FIG. 5 plus the delay 609 and selected incremental delay 607 of FIG. 6 is such that the signal arrives at the input of gate 611 at a time ahead of the next rising edge of CLK IN 112 equal to the DELAY X2 600.

The selected phase accounts for the delay from CLK IN 112 to the selected phase rising edge. It tracks frequency changes and is not affected by logic gate delay changes because all phases of the generated clocks are based on the 4×CLK edges which are fixed for the selected frequency.

Figure 6:
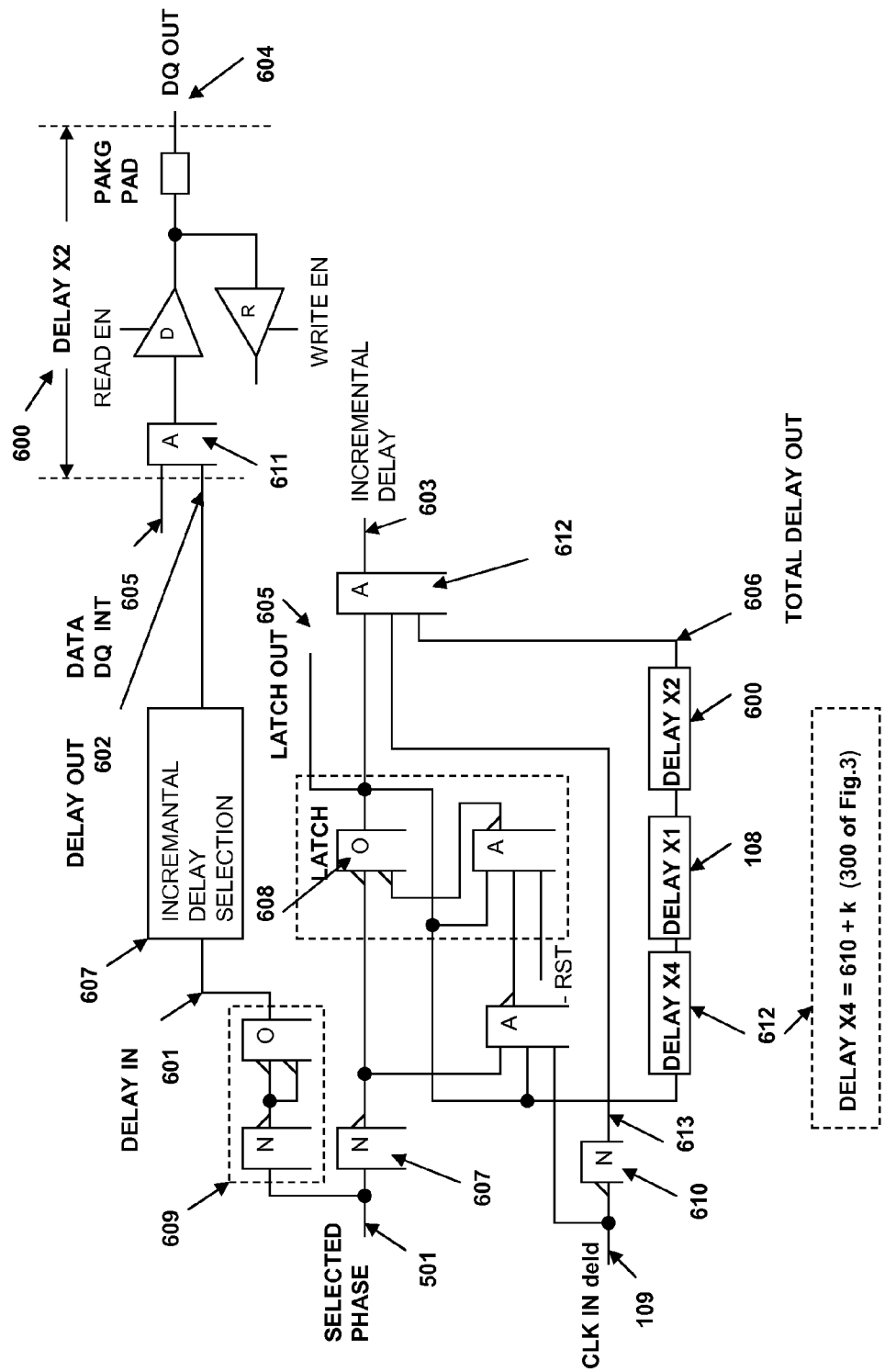
FIG. 6 depicts a digital logic implementation for incremental delay determination and delay selection.

Referring now to FIG. 6. The signal having the selected clock phase selected will pass through selection gates 502, 503 and 609 will be ahead of the next rising edge of the CLK IN by an amount greater than the DELAY X2 600 if there is no incremental delay added to the path.

Figure 7:
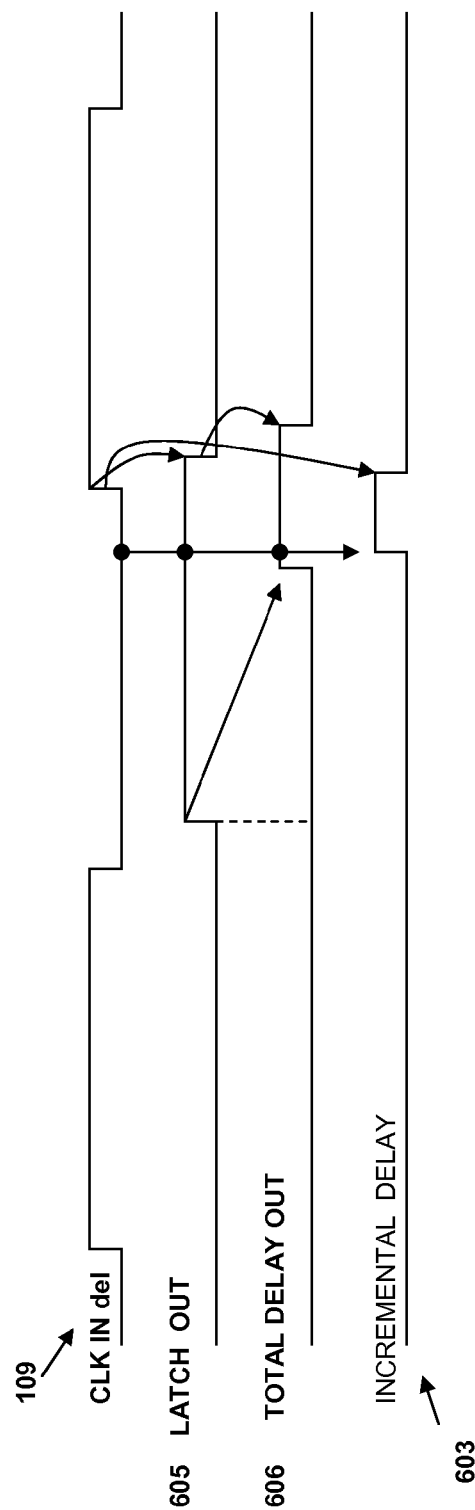
FIG. 7 depicts a timing diagram showing the incremental delay pulse generation.

The circuits shown in FIG. 6 are used to determine the incremental delay required. Referring now to that figure, it is seen that the selected clock phase is used to produce the signal LATCH OUT 605. This signal is run through a series of delays DELAY X4 612, DELAY X1 108 and DELAY X2 600 to produce the signal TOTAL DELAY OUT 606. The AND function 612 of the LATCH OUT, the TOTAL DELAY OUT 606 and the inverted CLK IN deld 109 signals 613 will produce the pulse INCREMENTAL DELAY 603 pulse shown in FIG. 7.

The gates of 609 are identical to gates 607 and 608 to produce the delay required to generate the signal LATCH OUT 605.

Figures 8A, 8B:
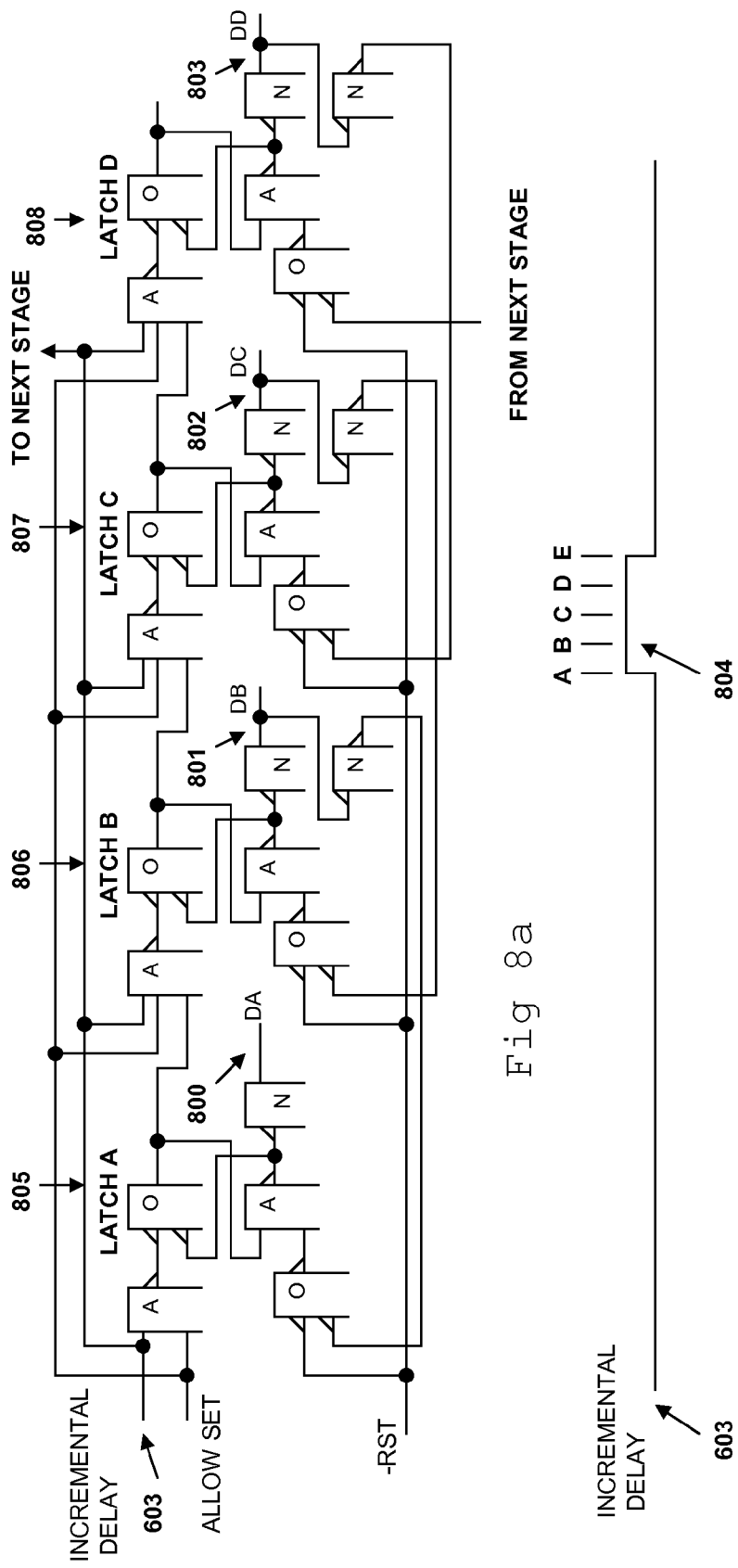

Referring now to FIG. 8, the next step is to quantize the width of the INCREMENTAL DELAY pulse in terms of time delay to be represented by gate delays.

The INCREMENTAL DELAY pulse 603 is applied to a series of SET/RESET latches 805, 806, 807 and 808 as shown. The number of latches required may be less or more than four, as shown in this figure. The time required to set each latch is dependent on the speed of the gates of the silicon process and internal wiring parasitics. Once the pulse is applied, each latch will be set in succession. Each setting of each latch resets the previous latch. At the end, there will only be one latch set. Each latch when set will be used to select a delay in the delay tree 902 shown in FIG. 9.

Figure 9:
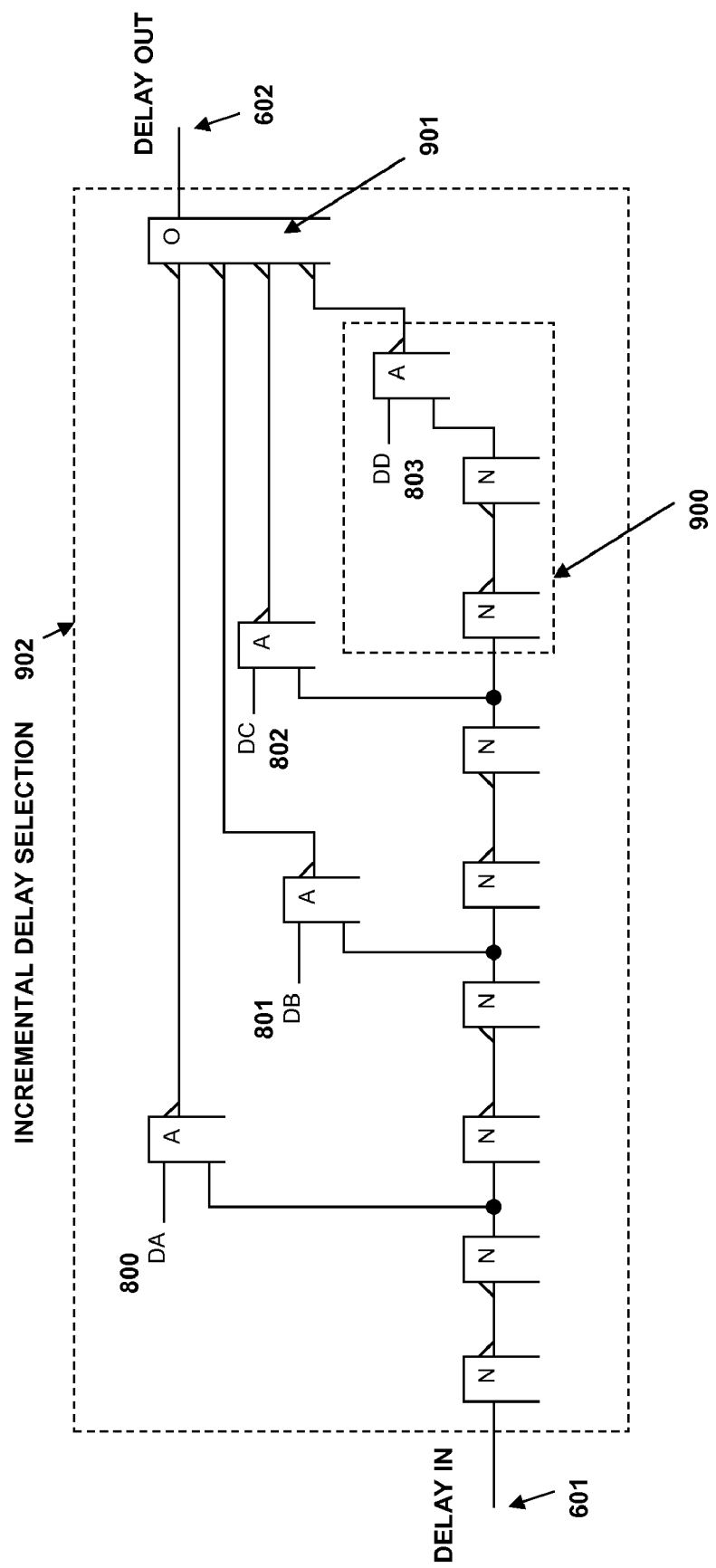
FIG. 9 depicts a block diagram showing the details of the incremental delay section of FIG. 6.

Referring now to FIG. 9. Each delay section 900 will represent a delay number based on the speed of the gates if it is implemented with gates. Delays could also be implemented in passive form. The selected delay will fine adjust the path so that the selected clock phase arrives at the input 602 of the driver gate 611, as seen in FIG. 6, at the predetermined time so that the DQ OUT 604 rising edge aligns to the rising edge of the CLK IN 112. The number of delay arrangements 900 depends on the number of latches implemented in FIG. 8. For example, latch output 803 will select the total delay string. The total selected delay consists of all the delay sections from the DELAY IN 601 input to the output of the OR gate 901. The total delay is designed to meet requirements based on silicon process speed. There will be a nominal, a minimum and a maximum speed variation from device to device and from lot to lot manufactured. If the device is slow, each delay section in the tree 902 will produce a longer delay and each latch in FIG. 8 will take longer to set, thus resulting in lower delay value. If the device is fast the corresponding opposite will occur. This phenomenon will keep the delay calibrated.

Second Embodiment

Figure 10:
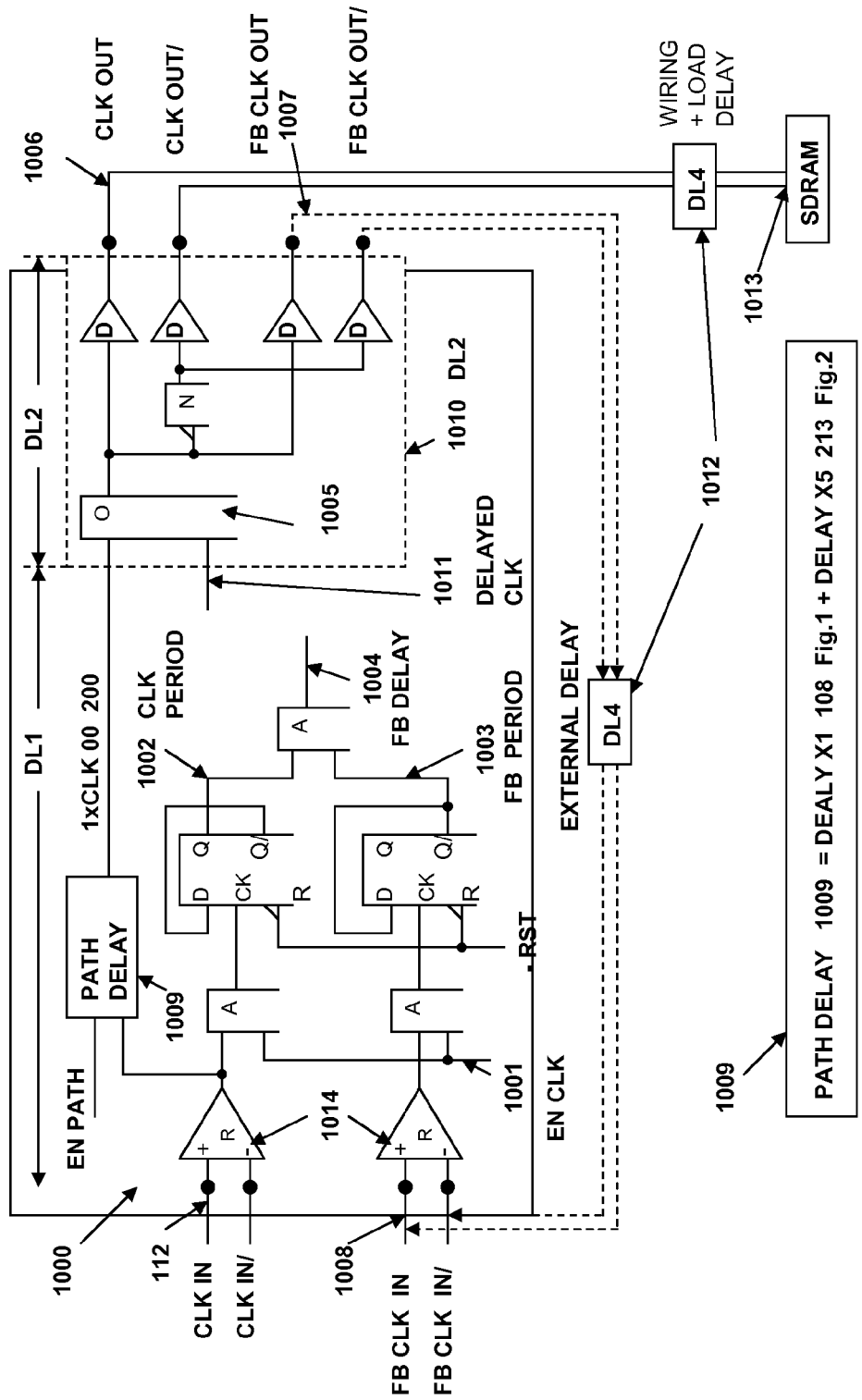
FIG. 10 depicts a block diagram of clock paths for CLK IN and the clock driving an external device along with the feedback path for synchronization.

Referring now to FIG. 10, In a second embodiment of the invention, a silicon device 1000 takes the input CLK IN 112 and produces outputs (multiple copies) CLK OUT 1001 and a FB OUT 1006 for feedback. Outputs 1001 are fed to the input 1013 of devices, such as SDRAM, at distant points.

There is a delay DL4 1012 from CLK OUT 1001 to the input of SDRAM at point 1013 due to wiring and printed circuit board parasitics.

The requirement is that the clock at the input of SDRAM at point 1013 and the CLK IN 112 be phase aligned.

The CLK OUT 1006 and the CLK IN 112 are, first, phase aligned according to the first embodiment and the methods and circuits described above. Then, the DELAYED CLK 1011 is further adjusted so that it appears earlier by an amount of time equal to the delay DL4 1012. To determine the value of DL4 1012, refer to the block diagram FIG. 10 and timing diagram FIG. 10A.

Figure 10A:
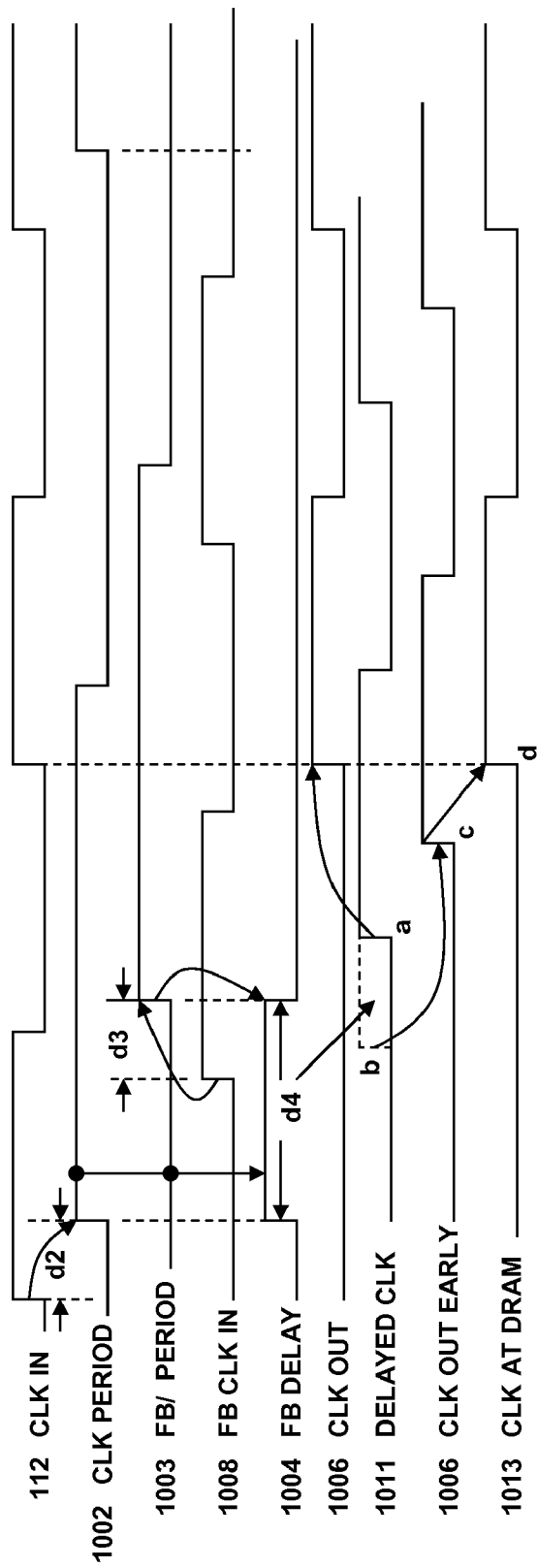
FIG. 10a depicts a timing diagram of the circuit of FIG. 10.

The delay DL4 1012 from the CLK OUT 1006 to the SDRAM device input 1013 is duplicated and applied to the path from the FB CLK OUT 1007 to the input FB CLK IN 1008. The receivers 1014 and the paths for CLK PERIOD 1002 and FB PERIOD 1003 are identical. When both period signals are ANDed, a FB DELAY 1004 pulse is created and is shown in FIG. 10A as d4. This pulse is converted to time delay by applying it to a circuit similar to the one shown in FIG. 8 and by selection of the delay from the delay tree of FIG. 9. The number of elements in FIG. 8 and FIG. 9 will have to be increased in order to accommodate all the delay adjustments. The amount of delay determined will be subtracted from the delay originally selected to have the CLK OUT 1006 in phase with the CLK IN 112. The delay selected is saved and always is applied as coarse delay adjustment for the feedback loop. After the initial coarse delay adjustment, there will be a shorter FB DELAY 1004 pulse created. This pulse is further applied to another circuit similar to the one in FIG. 8 for further fine delay adjustment. Ideally, there shouldn't be any FB DELAY 1004 pulse created after all the adjustments. This will depend on the techniques used to resolve the FB DELAY 1004 pulse duration. The remaining pulse will represent the phase difference of the CLK IN 112 and the CLK OUT at 1013 of the SDRAM. This phase difference must be within acceptable measure. This fine delay adjustment may be dynamically tested every clock cycle to continuously synchronize the clocks or tested in time intervals.

The proposed synchronization methods can be applied to devices other than zero buffer type. Such devices include all of the memory devices Dynamic, Static or Flash and in memory controllers and CPU's.

Figure 11:
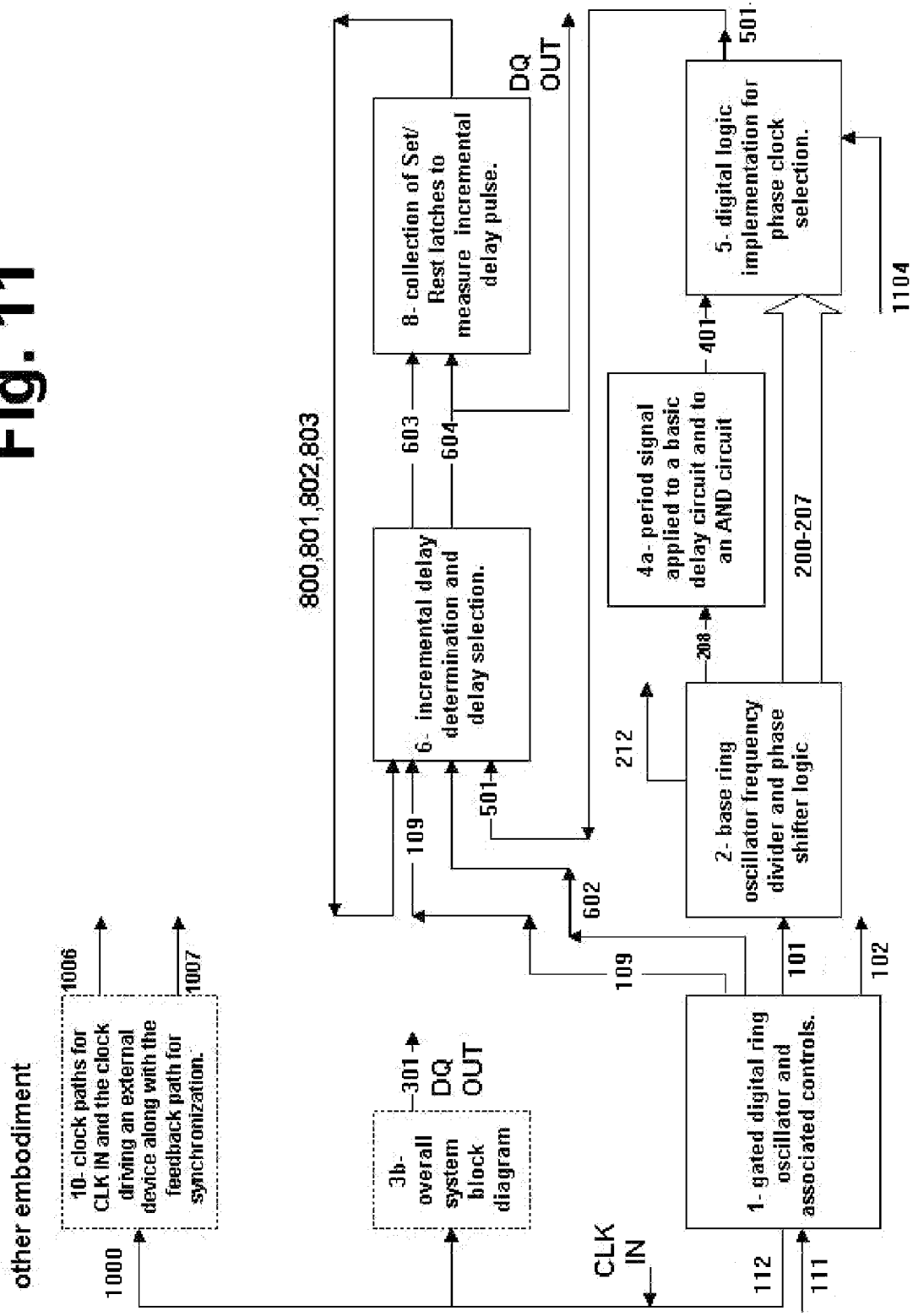
FIG. 11 depicts an overall block diagram of the preferred embodiment of this system.
Figure 1:
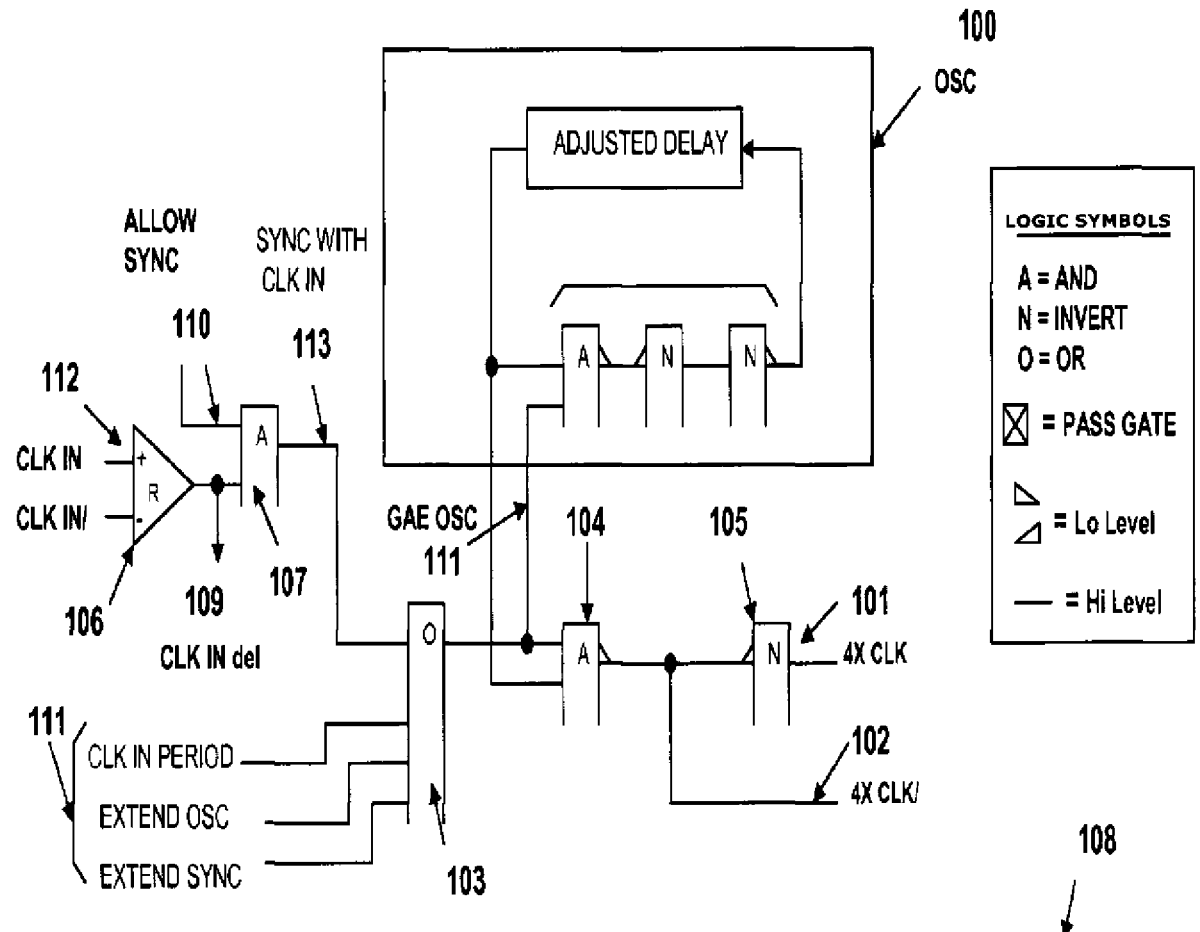

Referring now to FIG. 11, the relationship between the signals in the individual drawings is shown. The numbers of the individual blocks in this drawing correspond to the figure numbers of the other drawings. For instance, the block entitled "1. gated ring oscillator and associated controls" corresponds to FIG. 1. The reference numbers of the signals shown corresponds to the reference numbers in the other drawings.

It will be apparent that improvements and modifications may be made within the purview of the invention without departing from the scope of the invention defined in the appended claims.

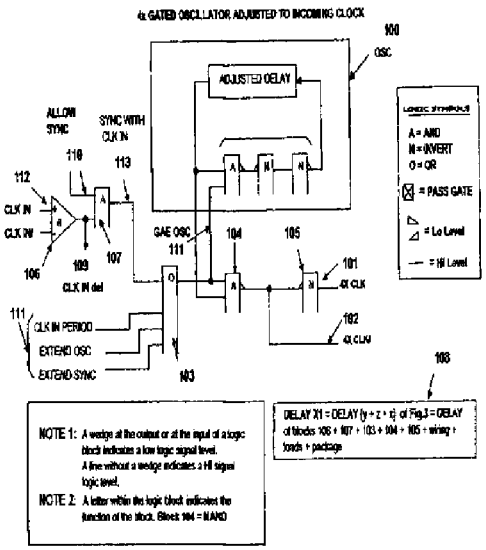

The invention claimed is:

1. A method of producing an output clock signal for transmission to a device, the method comprising:
    generating, using an oscillating circuit, a first internal clock signal having a first frequency that is $2^n$ times an input frequency of an input clock signal, where n is an integer;
    generating, using the oscillating circuit, a second internal clock signal based on the first internal clock signal, wherein the second internal clock signal has a second frequency that is substantially the same as the input frequency;
    generating, using the oscillating circuit, a first output clock signal based on the second internal clock signal by applying a first time delay to the second internal clock signal such that the first output clock signal is aligned in phase with the input clock signal, wherein the first time delay is based on a phase difference between the input clock signal and the second internal clock signal; and
    generating, using the oscillating circuit, a second output clock signal configured to be provided to the oscillating circuit as feedback, wherein:

the first output clock signal is transmitted to the device;
the second output clock signal is delayed by a second time delay equal to a transmission delay associated with transmitting the first output clock signal from an output of the oscillating circuit to an input of the device;
the first output clock signal is generated based on the second output clock signal;
the phase of the generated first output clock signal is shifted by a time substantially equal to the transmission delay; and
the first output clock signal is substantially in phase with the input clock signal when received at the input of the device.

2. The method of claim 1, further comprising generating a plurality of internal clock signals based on the first internal clock signal, wherein each of the plurality of internal clock signals has substantially the same frequency as the input clock signal, and wherein the second internal clock signal is selected from among the plurality of internal clock signals.

3. The method of claim 2, wherein a phase difference between consecutive ones of the plurality of internal clock signals is one of 22.5 degrees or 45 degrees.

4. The method of claim 1, wherein the first time delay comprises the phase difference between the second internal clock signal and the input clock signal shortened by another time delay associated with a portion of the oscillating circuit that is configured to drive the first output clock signal based on the second internal clock signal.

5. The method of claim 1, wherein said generating a first output clock signal comprises using a digital latch to apply the first time delay.

6. A system for producing an output clock signal for transmission to a device, the system comprising:
an oscillating circuit configured to:
generate a first internal clock signal at a first frequency that is $2^n$ times a frequency of the input clock signal, where n is an integer;
generate a plurality of internal clock signals based on the first internal clock signal, wherein each of the plurality of internal clock signals has a frequency that is substantially the same as the input frequency;
select a second internal clock signal from among the plurality of internal clock signals; and
generate the output clock signal based on the second internal clock signal by applying a time delay to the second internal clock signal such that the output clock signal is aligned in phase with the input clock signal, wherein the time delay is based on a phase difference between the input clock signal and the second internal clock signal.

7. The system of claim 6, wherein a phase difference between consecutive ones of the plurality of internal clock signals is one of 22.5 degrees or 45 degrees.

8. The system of claim 6, wherein the time delay comprises the phase difference between the second internal clock signal and the input clock signal shortened by another time delay associated with a portion of the oscillating circuit that is configured to drive the output clock signal based on the second internal clock signal.

9. The system of claim 6, wherein the output clock signal comprises a first output clock signal, and wherein the oscillating circuit is further configured to generate another output clock signal configured to be provided to the oscillating circuit as feedback, wherein:
the first output clock signal is transmitted to the device;
the second output clock signal is delayed by another time delay equal to a transmission delay associated with transmitting the first output clock signal from an output of the oscillating circuit to an input of the device;
the first output clock signal is generated based on the second output clock signal;
the phase of the generated first output clock signal is shifted by a time substantially equal to the transmission delay; and
the first output clock signal is substantially in phase with the input clock signal when received at the input of the device.

10. The system of claim 6, wherein the oscillating circuit comprises a digital latch configured to apply the time delay.

11. A method of producing an output clock signal for transmission to a device, the method comprising:
generating a first internal clock signal having a first frequency that is $2^n$ times an input frequency of an input clock signal, where n is an integer;
generating a plurality of additional internal clock signals based on the first internal clock signal, wherein each of the plurality of internal clock signals has substantially the same frequency as the input clock signal;
selecting a second internal clock signal from among the plurality of additional internal clock signals; and
generating the output clock signal based on the second internal clock signal by applying a time delay to the second internal clock signal such that the output clock signal is aligned in phase with the input clock signal, wherein the time delay is based on a phase difference between the input clock signal and the second internal clock signal.

12. The method of claim 11, wherein a phase difference between consecutive ones of the plurality of additional internal clock signals is one of 22.5 degrees or 45 degrees.

13. The method of claim 11, wherein said generating a first internal clock signal, said generating a plurality of additional internal clock signals, said selecting a second internal clock signal, and said generating the output clock signal are performed using an oscillating circuit.

14. The method of claim 13, wherein the time delay comprises the phase difference between the second internal clock signal and the input clock signal shortened by another time delay associated with a portion of the oscillating circuit that is configured to drive the output clock signal based on the second internal clock signal.

15. The method of claim 13, wherein the output clock signal comprises a first output clock signal, and wherein the method further comprises generating another output clock signal configured to be provided to the oscillating circuit as feedback, wherein:
the first output clock signal is transmitted to the device;
the second output clock signal is delayed by another time delay equal to a transmission delay associated with transmitting the first output clock signal from an output of the oscillating circuit to an input of the device;
the first output clock signal is generated based on the second output clock signal;
the phase of the generated first output clock signal is shifted by a time substantially equal to the transmission delay; and
the first output clock signal is substantially in phase with the input clock signal when received at the input of the device.

16. The method of claim 11, wherein said generating the output clock signal comprises using a digital latch to apply the time delay.

* * * * *

UNITED STATES PATENT AND TRADEMARK OFFICE
CERTIFICATE OF CORRECTION

| | | |
|---|---|---|
| PATENT NO. | : 8,134,412 B2 | |
| APPLICATION NO. | : 12/555139 | |
| DATED | : March 13, 2012 | |
| INVENTOR(S) | : Karabatsos | |

It is certified that error appears in the above-identified patent and that said Letters Patent is hereby corrected as shown below:

Delete the title page showing an illustrative figure and substitute the attached title page therefor.

On the Title Page, in the Figure, delete "LOGIC SMBOLS" and insert -- LOGIC SYMBOLS --, therefor.

Figure 3:
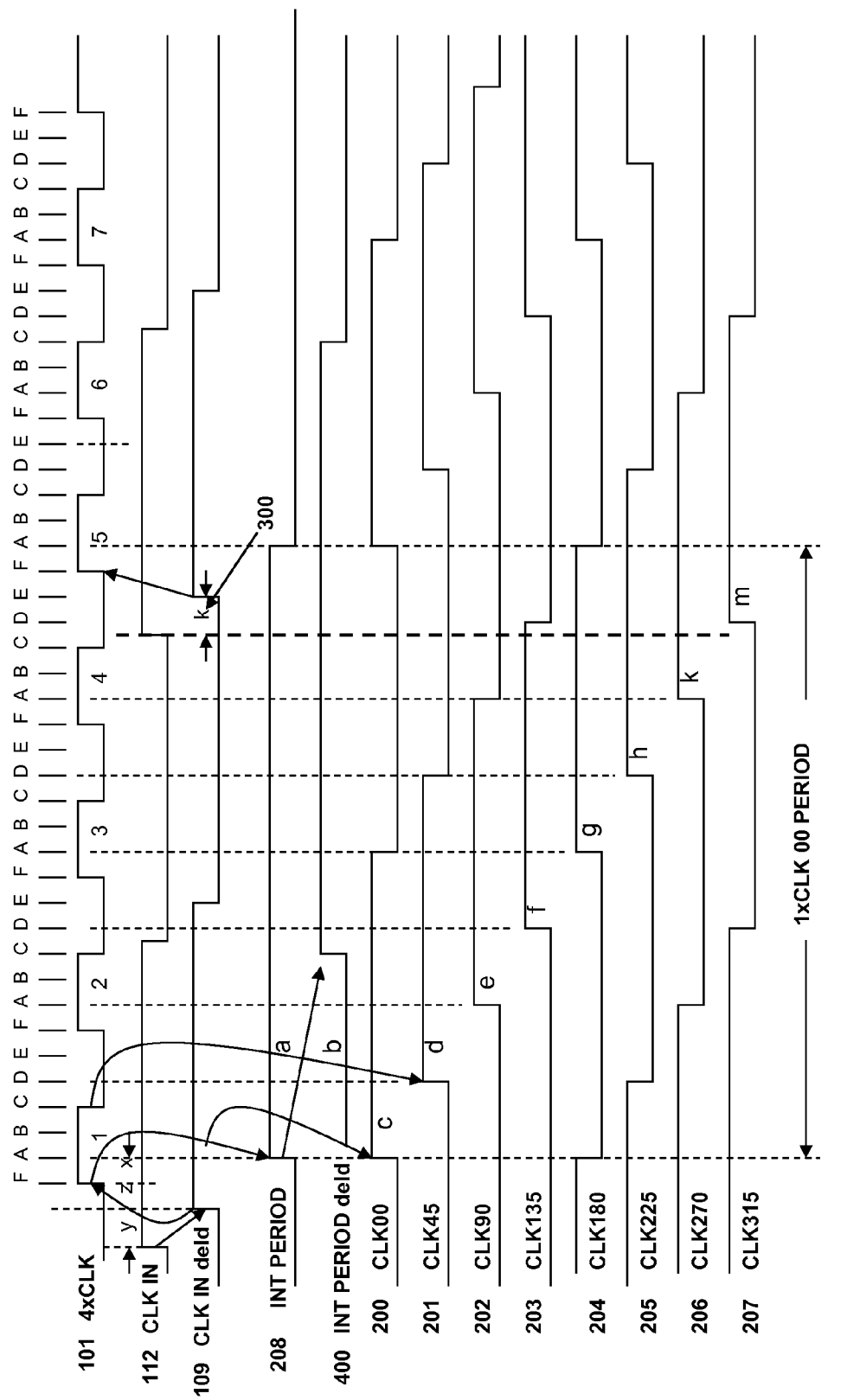
FIG. 3a depicts a timing diagram to show how periods of different clocks, including phase shifted clocks, relate to the ring oscillator base signal.
FIG. 3b depicts a period signal applied to a delay circuit.
FIG. 3c depicts a timing diagram of signals appearing in FIG. 3b.
Figures 3A, 3B:
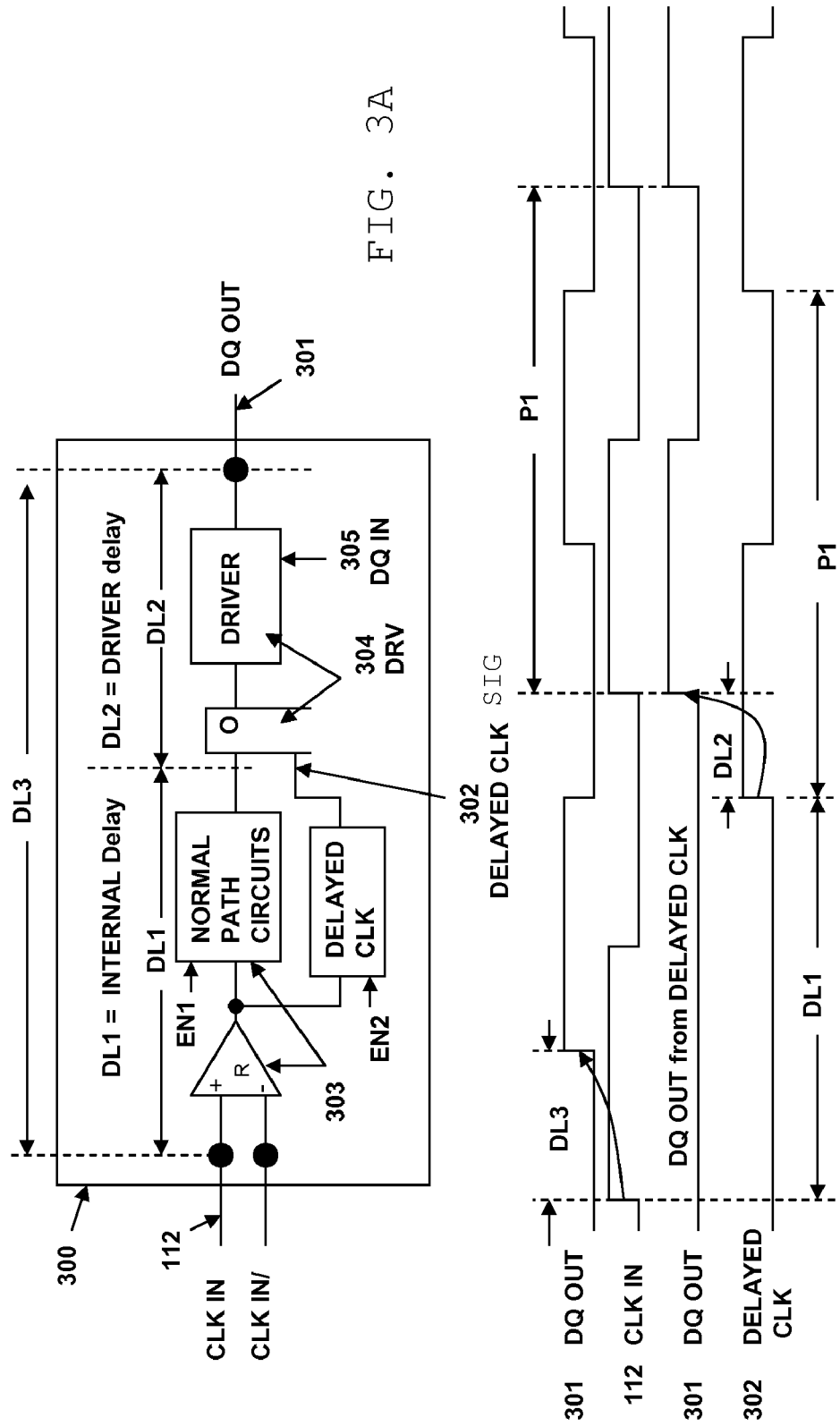

On the Title Page, in the Figure, for Tag "108", in Line 1, delete "Fig 3=DELAY" and insert -- Fig. 3=DELAY --, therefor.

Figure 1:
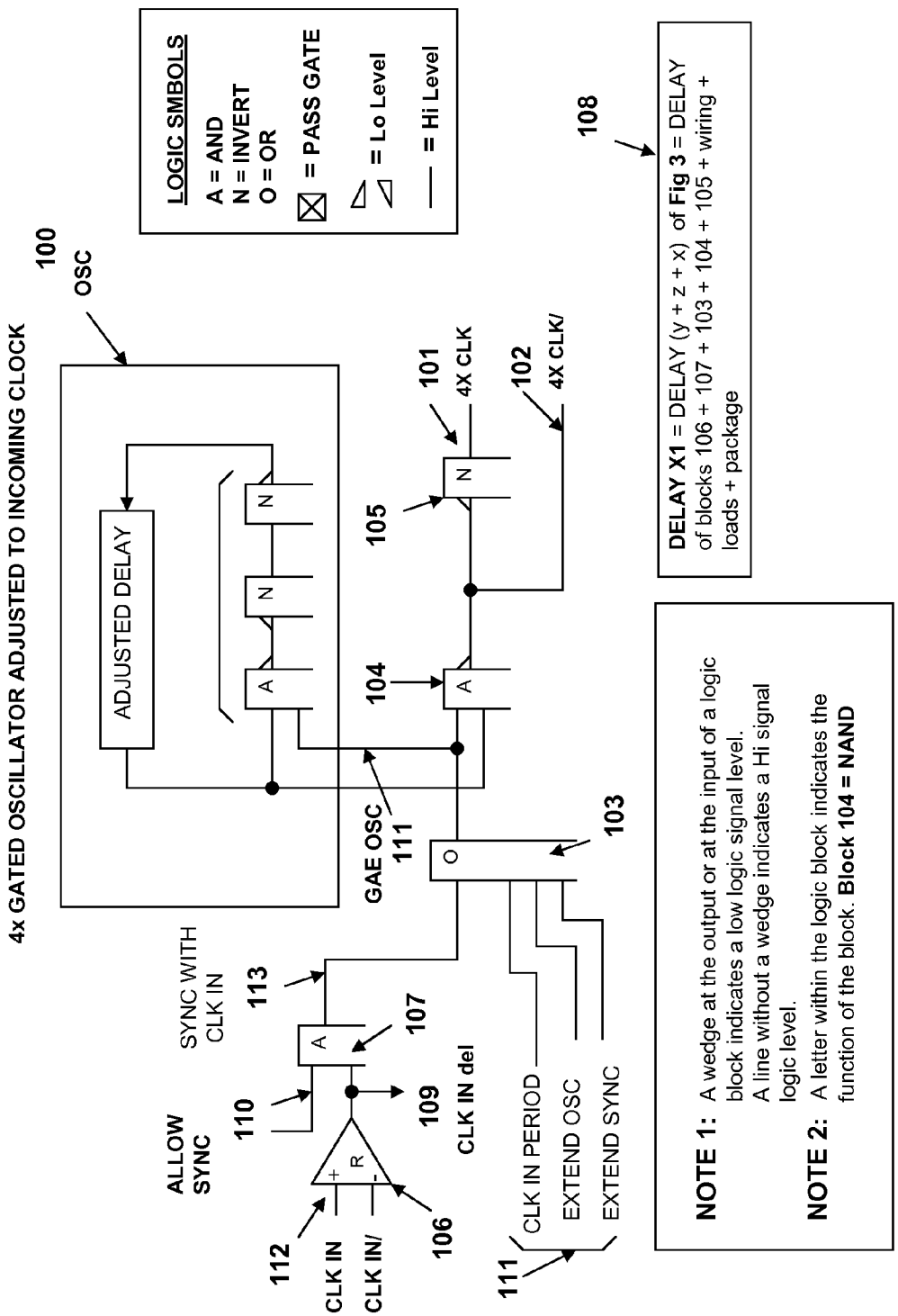
FIG. 1 depicts block diagram of the gated digital ring oscillator and associated controls.

In Fig. 1, Sheet 1 of 13, delete "LOGIC SMBOLS" and insert -- LOGIC SYMBOLS --, therefor.

In Fig. 1, Sheet 1 of 13, for Tag "108", in Line 1, delete "Fig 3=DELAY" and insert -- Fig. 3=DELAY --, therefor.

In Fig. 1, Sheet 1 of 13, delete "Fig" and insert -- Fig. --, therefor at each occurrence throughout the figures.

In Fig. 3, Sheet 3 of 13, delete "Fig 3" and insert -- Fig. 3a --, therefor.

In Fig. 3A, Sheet 4 of 13, delete "FIG. 3A" and insert -- Fig. 3b --, therefor.

In Fig. 3b, Sheet 4 of 13, delete "FIG. 3b" and insert -- Fig. 3c --, therefor.

In Fig. 4a, Sheet 5 of 13, delete "ALOW" and insert -- ALLOW --, therefor.

In Fig. 6, Sheet 7 of 13, for Tag "607", in Line 1, delete "INCREMANTAL" and insert -- INCREMENTAL --, therefor.

In Column 1, Line 4, delete "REFERENCE" and insert -- CROSS-REFERENCE --, therefor.

Signed and Sealed this
Twenty-fifth Day of September, 2012

David J. Kappos
*Director of the United States Patent and Trademark Office*

In Column 3, Line 23, delete "R=receiver" and insert -- R=receiver. --, therefor.

In Column 3, Line 67, delete "FIG." and insert -- FIG. 5. --, therefor.

In Column 5, Line 54, delete "In a" and insert -- in a --, therefor.

(12) United States Patent
Karabatsos

(10) Patent No.: US 8,134,412 B2
(45) Date of Patent: Mar. 13, 2012

(54) SYNCHRONIZATION OF A DATA OUTPUT SIGNAL TO AN INPUT CLOCK

(75) Inventor: Chris Karabatsos, Kingston, NY (US)

(73) Assignee: Urenschi Assets Limited Liability Company, Dover, DE (US)

(*) Notice: Subject to any disclaimer, the term of this patent is extended or adjusted under 35 U.S.C. 154(b) by 36 days.

(21) Appl. No.: 12/555,139

(22) Filed: Sep. 8, 2009

(65) Prior Publication Data
US 2011/0181365 A1 Jul. 28, 2011

Related U.S. Application Data

(63) Continuation-in-part of application No. 12/356,130, filed on Jan. 20, 2009, now Pat. No. 7,605,666, which is a continuation-in-part of application No. 11/843,267, filed on Aug. 22, 2007, now Pat. No. 7,498,887, which is a continuation of application No. 11/308,518, filed on Mar. 31, 2006, now Pat. No. 7,276,982.

(60) Provisional application No. 60/670,618, filed on Apr. 13, 2005, provisional application No. 60/666,603, filed on Mar. 31, 2005.

(51) Int. Cl.
*H03L 7/00* (2006.01)
(52) U.S. Cl. .............. 331/16; 331/25; 331/57; 327/141
(58) Field of Classification Search .......... 331/16, 331/25, 57; 327/103–107, 141–163
See application file for complete search history.

(56) References Cited

U.S. PATENT DOCUMENTS

| | | | |
|---|---|---|---|
| 5,796,673 A | 8/1998 | Foss et al. | |
| 6,075,415 A * | 6/2000 | Milton et al. | 331/25 |
| 6,396,312 B1 | 5/2002 | Shepston et al. | |
| 6,608,530 B1 | 8/2003 | Green et al. | |
| 6,917,660 B2 | 7/2005 | Song | |
| 7,206,370 B2 | 4/2007 | Nakao | |
| 7,605,666 B2 * | 10/2009 | Karabatsos | 331/16 |
| 2002/0105389 A1 | 8/2002 | Nishimura et al. | 331/100 |
| 2004/0095861 A1 * | 5/2004 | Hsu et al. | 369/47.28 |

OTHER PUBLICATIONS

Non-final Office Action issued in U.S. Appl. No. 11/308,518 and mailed on Apr. 27, 2007.
Non-final Office Action issued in U.S. Appl. No. 11/843,267 and mailed on Sep. 15, 2008.
Notice of Allowance issued in U.S. Appl. No. 11/308,518 and mailed on May 29, 2007.
Notice of Allowance issued in U.S. Appl. No. 11/733,254 and mailed Jun. 4, 2009.
Notice of Allowance issued in U.S. Appl. No. 11/843,267 and mailed Oct. 17, 2008.
Notice of Allowance issued in U.S. Appl. No. 12/356,130 and mailed on Jun. 5, 2009.

* cited by examiner

*Primary Examiner* — Joseph Chang
*Assistant Examiner* — Jeffrey Shin

(57) ABSTRACT

A digital apparatus for phase aligning output signals of a silicon device to an applied input clock signal in same device allows synchronization of data transfers between the device and another device such as a controller. It includes a digital or analog oscillator of higher frequencies than the applied clock and in multiples of powers $2^n$ where $n=1, 2, 4$, etc., with provisions for synchronization and control by the applied input clock. The main oscillator frequency is subdivided to lower frequencies. An internally derived duplicate frequency clock is phase shifted by either 45 or 22.5 degrees. The system measure both a desired coarse delay, and a fine delay to be applied to the path to phase align the output signal to the phase of the applied input clock.

16 Claims, 13 Drawing Sheets